(12) United States Patent
Arndt

(10) Patent No.: US 8,975,646 B2
(45) Date of Patent: Mar. 10, 2015

(54) OPTOELECTRONIC SEMICONDUCTOR COMPONENT AND HOUSING BASE FOR SUCH A COMPONENT

(75) Inventor: Karlheinz Arndt, Bad Abbach (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 742 days.

(21) Appl. No.: 11/597,971

(22) PCT Filed: May 12, 2005

(86) PCT No.: PCT/DE2005/000877
§ 371 (c)(1),
(2), (4) Date: Nov. 29, 2006

(87) PCT Pub. No.: WO2005/117071
PCT Pub. Date: Dec. 8, 2005

(65) Prior Publication Data
US 2008/0012033 A1   Jan. 17, 2008

(30) Foreign Application Priority Data

May 31, 2004   (DE) .......................... 10 2004 026 858
Aug. 20, 2004   (DE) .......................... 10 2004 040 468

(51) Int. Cl.
*H01L 33/00*   (2010.01)
*H01L 33/60*   (2010.01)
(Continued)

(52) U.S. Cl.
CPC ............... *H01L 33/60* (2013.01); *H01L 33/486* (2013.01); *H01L 33/52* (2013.01); *H01L 2224/48091* (2013.01); *H01L 2224/48247* (2013.01); *H01L 2924/3025* (2013.01)
USPC .................... 257/81; 257/91; 257/95; 257/98; 257/99; 257/100; 257/E33.055; 257/E33.056; 257/E33.057; 257/E33.067

(58) Field of Classification Search
USPC ............. 257/81, 91, 95, 98, 99, 100, 257/E33.055–E33.072, 678–744
See application file for complete search history.

(56) References Cited

U.S. PATENT DOCUMENTS 4,538,168 A * 8/1985 Van Dyk Soerewyn ...... 257/693
4,727,457 A   2/1988 Thillays
(Continued)

FOREIGN PATENT DOCUMENTS

CN   1355571   6/2002
CN   1380703   11/2002
(Continued)

OTHER PUBLICATIONS

IBM Technical Disclosure Bulletin, May 1991, pp. 61-62.*
(Continued)

*Primary Examiner* — Hrayr A Sayadian
(74) *Attorney, Agent, or Firm* — Fish & Richardson P.C.

(57) ABSTRACT

An optoelectronic semiconductor component comprising at least one radiation emitting semiconductor chip disposed in a recess of a housing base body, wherein the recess is bounded laterally by a wall surrounding the semiconductor chip and is at least partially filled with an encapsulant that covers the semiconductor chip and is well transparent to an electromagnetic radiation emitted by the semiconductor chip An inner side of the wall, bounding the recess, is configured such that, as viewed looking down on the front side of the semiconductor component, a subarea of the inner side is formed which extends ring-like all the way around the semiconductor chip and which is in shadow as viewed from the radiation emitting semiconductor chip and which is at least partially covered by encapsulant all the way around the semiconductor chip. A housing base body for such a semiconductor component is also specified.

23 Claims, 3 Drawing Sheets

(51) Int. Cl.
  *H01L 33/48* (2010.01)
  *H01L 33/52* (2010.01)

(56) References Cited

U.S. PATENT DOCUMENTS

| | | | |
|---|---|---|---|
| 5,040,868 A | | 8/1991 | Waitl et al. |
| 5,043,716 A | | 8/1991 | Latz et al. |
| 5,173,766 A | * | 12/1992 | Long et al. ............... 257/687 |
| 5,331,512 A | | 7/1994 | Orton |
| 5,530,285 A | * | 6/1996 | Brenndoerfer ............. 257/691 |
| 5,545,359 A | | 8/1996 | Axkley et al. |
| 5,553,028 A | | 9/1996 | McLaury |
| 5,614,131 A | | 3/1997 | Mukerji et al. |
| 5,686,172 A | | 11/1997 | Ohya et al. |
| 5,821,615 A | | 10/1998 | Lee |
| 6,052,500 A | | 4/2000 | Takano et al. |
| 6,060,729 A | | 5/2000 | Suzuki et al. |
| 6,066,861 A | | 5/2000 | Höhn et al. |
| 6,103,398 A | | 8/2000 | Norton et al. |
| 6,274,890 B1 | | 8/2001 | Oshio et al. |
| 6,274,924 B1 | * | 8/2001 | Carey et al. ............... 257/676 |
| RE37,554 E | | 2/2002 | Brunner et al. |
| 6,440,877 B1 | | 8/2002 | Yamazaki et al. |
| 6,610,563 B1 | | 8/2003 | Waitl et al. |
| 6,624,491 B2 | | 9/2003 | Waitl et al. |
| 6,639,354 B1 | * | 10/2003 | Kojima et al. ............. 313/498 |
| 6,669,866 B1 | | 12/2003 | Kummer et al. |
| 6,897,490 B2 | | 5/2005 | Brunner et al. |
| 6,943,433 B2 | * | 9/2005 | Kamada ..................... 257/666 |
| 6,946,714 B2 | | 9/2005 | Waitl et al. |
| 6,960,878 B2 | * | 11/2005 | Sakano et al. .............. 313/512 |
| 7,078,732 B1 | | 7/2006 | Reeh et al. |
| 7,727,457 B2 | | 6/2010 | Morrow et al. |
| 2001/0010371 A1 | | 8/2001 | Carey et al. |
| 2002/0004251 A1 | | 1/2002 | Roberts et al. |
| 2002/0161669 A1 | | 10/2002 | Kitahara et al. |
| 2002/0163302 A1 | | 11/2002 | Nitta et al. |
| 2002/0185965 A1 | | 12/2002 | Collins, III et al. |
| 2003/0020077 A1 | * | 1/2003 | Horiuchi et al. ............. 257/81 |
| 2003/0080341 A1 | | 5/2003 | Sakano et al. |
| 2003/0155624 A1 | * | 8/2003 | Arndt et al. ............... 257/432 |
| 2003/0230751 A1 | | 12/2003 | Harada |
| 2004/0016873 A1 | | 1/2004 | Kida et al. |
| 2004/0065894 A1 | | 4/2004 | Hashimoto et al. |
| 2004/0079957 A1 | | 4/2004 | Andrews et al. |
| 2004/0089957 A1 | | 5/2004 | Shizuno |
| 2006/0022215 A1 | | 2/2006 | Arndt et al. |

FOREIGN PATENT DOCUMENTS

| | | | |
|---|---|---|---|
| CN | 1399355 | 2/2003 | |
| CN | 1455960 | 11/2003 | |
| DE | 3719338 | 12/1988 | |
| DE | 19536454 | 4/1997 | |
| DE | 19854414 | 5/1999 | |
| DE | 19947044 | 5/2001 | |
| DE | 10020 465 | 11/2001 | |
| DE | 101 22002 | 11/2002 | |
| EP | 0230336 | 7/1987 | |
| EP | 0374121 | 6/1990 | |
| EP | 0400176 | 12/1990 | |
| EP | 0854523 | 7/1998 | |
| EP | 1249873 | 10/2002 | |
| GB | 2 206444 | 1/1989 | |
| JP | 57-085273 | 5/1982 | |
| JP | 60-020587 | 2/1985 | |
| JP | 08032120 | 2/1996 | |
| JP | 10190066 | 12/1996 | |
| JP | 09027643 | 1/1997 | |
| JP | 09083018 | 3/1997 | |
| JP | 0210606 | 7/1998 | |
| JP | 10-215001 | 8/1998 | |
| JP | 10-240165 | 9/1998 | |
| JP | 10-261821 | 9/1998 | |
| JP | 11-74561 | 3/1999 | |
| JP | 2000-150968 | 5/2000 | ............ H01L 33/00 |
| JP | 2000-353827 | 12/2000 | |
| JP | 2002-049383 | 2/2002 | |
| JP | 2003-110149 | 4/2003 | ............ H01L 33/00 |
| JP | 2003-110153 | 4/2003 | ............ H01L 33/00 |
| JP | 2004-056075 | 2/2004 | |
| JP | 2004-111906 | 4/2004 | |
| JP | 2004-140220 | 5/2004 | |
| JP | 2004-3886 | 8/2004 | |
| JP | 2006-516816 | 7/2006 | |
| WO | WO 82/04500 | 12/1982 | |
| WO | WO 83/00408 | 2/1983 | |
| WO | WO 97/50132 | 12/1997 | |
| WO | WO 98/12757 | 3/1998 | |
| WO | WO 01/06546 | 1/2001 | |
| WO | WO 01/08452 | 2/2001 | |
| WO | WO 01/82385 | 11/2001 | |
| WO | WO 02/091478 | 11/2002 | |
| WO | WO 03/019679 | 3/2003 | |
| WO | WO 2004/068594 | 8/2004 | |

OTHER PUBLICATIONS

Möllmer, F. and Waitl, G., "Siemens-SMT-TOP-LED-LEDs for Surface Mounting", *Siemens Components*, vol. 29, No. 4-5, pp. 147-149, 1991.

Authorized officer: Krause, J., *International Search Report*, PCT/DE2005/000877, Jun. 21, 2005.

"Translation of the Decision of Refusal", JP Patent Application No. 2007-513672, issued on Mar. 7, 2012 (2 pages).

Japan Patent Office, "Notice of Reasons for Rejection", JP Appl. No. 2010-247343, issued on Oct. 23, 2012 (4 pages).

Notification of Reasons for Refusal (Type I Office Action) for Japanese Patent Application No. 2007-513672 dated Apr. 2, 2013.

* cited by examiner

US 8,975,646 B2

OPTOELECTRONIC SEMICONDUCTOR COMPONENT AND HOUSING BASE FOR SUCH A COMPONENT

CROSS-REFERENCE TO RELATED APPLICATIONS

This application is the National Stage of International Application No. PCT/DE2005/000877, filed on May 12, 2005, which claims the priority to German Patent Applications Serial No. 10 2004026858.4, filed on May 31, 2004 and Serial No. 10 2004040468.2, filed on Aug. 20, 2004. The contents of all applications are hereby incorporated by reference in their entireties.

FIELD OF THE INVENTION

The invention relates to an optoelectronic semiconductor component, particularly to an electromagnetic radiation emitting semiconductor component and to a housing base body.

BACKGROUND OF THE INVENTION

It relates in particular to a surface-mountable optoelectronic component, particularly leadframe-based, in which the semiconductor chip is disposed in a recess of a housing base body and there fastened. The housing base body is preferably prefabricated before the semiconductor chip is mounted in the recess.

Such semiconductor components are known for example from *Siemens Components* 29 (1991), Volume 4, pages 147-149. The encapsulant is conventionally for example an epoxy-resin-based potting material. However, such potting materials are often susceptible to UV radiation. They yellow relatively quickly under the effect of UV radiation and consequently reduce light output from the component.

To improve the UV resistance of radiation emitting optoelectronic semiconductor components, it has been proposed to use encapsulants based on or comprised of silicone resin. Such encapsulants do not yellow under the effect of shortwave radiation, or do so at a sufficiently slow rate.

A problem with encapsulants of this kind, however, is that the bond they form with the materials conventionally used for the housing base body (for example, a polyphthalamide-based thermoplastic material) is not sufficiently resistant to ageing, especially under UV exposure, as is the case for example with epoxy resin. As a result, when such an encapsulant is used in conventional housing designs, as described for example in *Siemens Components* 29 (1991), Volume 4, pages 147 to 149, there is an increased risk of delamination between the housing base body and the encapsulant, beginning at the upper margin of the recess and propagating on into it. In the worst case, this can lead to complete detachment of the chip encapsulant from the housing base body.

SUMMARY OF THE INVENTION

The object underlying the present invention is to provide a semiconductor component and a housing base body respectively of the initially cited kinds, particularly a surface-mountable semiconductor component or a surface-mountable housing base body respectively of the initially cited kinds, which affords a reduced risk of delamination, particularly complete delamination between the encapsulant and the housing base body. In particular, a housing base body is to be provided that is suitable for greatly miniaturized optoelectronic housing designs, particularly for greatly miniaturized light-emitting diode and photodiode designs.

In the present context, the "front side" of the semiconductor component or the housing base body is always to be understood as that outer surface which is to be seen when looking down on the semiconductor component from its direction of emission, hence the surface from which the recess penetrates into the housing base body and through which electromagnetic radiation generated by the semiconductor chip is therefore emitted.

In a semiconductor component according to the invention, a wall bounding the recess is shaped such that there are formed on said wall, as viewed looking down on the front side of the semiconductor component,
i) plural shaded subareas arranged around the semiconductor chip,
ii) at least one shaded subarea that extends at least part of the way, preferably all the way, around the semiconductor chip.

"Shaded" means herein particularly that the subarea(s) concerned is (are) in shadow as viewed from substantially any point in a radiation emitting region of the radiation emitting semiconductor chip and is (are) at least partially covered by encapsulant and from which the encapsulant extends to the semiconductor chip and covers it.

In a particularly preferred semiconductor component and, respectively, a particularly preferred housing base body according to the invention, a wall bounding the recess is shaped such that as viewed looking down on the front side of the semiconductor component, a shaded subarea is formed which extends ring-like all the way around the semiconductor chip, and which in particular is in shadow as viewed from substantially any point in a radiation emitting region of the radiation emitting semiconductor chip and which is at least partially covered by encapsulant all the way around the semiconductor chip and from which the encapsulant extends to the semiconductor chip and covers it.

The shaded subarea extends particularly preferably in a funnel-like manner throughout, from the front side of the component toward the semiconductor chip, thereby causing the recess to taper toward the semiconductor chip.

The shaded subarea is particularly preferably disposed at the top margin of the wall, in such fashion that the three-phase boundary line between the air, the encapsulant and the housing base body extends entirely within the shaded subarea and therefore is impinged on not at all, or to a sufficiently reduced extent (for example, due to reflection from the front side of the encapsulant), by radiation that has originated in the semiconductor chip and is undesirable at this location.

The at least one shaded subarea is preferably formed at the margin of the recess with the front side of the housing base body, particularly at the front-side end face of the wall, or itself constitutes the front-side end face of the wall. This advantageously makes it possible to implement the shaded subarea and thus the component as a whole in an extremely space-saving manner without having to reduce the size of the (reflecting) recess in comparison to conventional components with no UV problems or epoxy encapsulant.

The at least one shaded subarea can advantageously be formed in a particularly technically simple manner by means of at least one, or where space-saving is necessary preferably by means of only one, chamfer provided at the front-side margin of the wall and sloping toward the recess. In this case, the front-side margin of the recess is configured in the manner of a funnel directed toward the semiconductor chip. In one advantageous embodiment, the end face of the wall is configured as at least partially funnel-like over its entire width and is therefore to be considered at least partially as part of the recess.

A shaded subarea that is configured as funnel-like throughout, as is made possible by an inventive configuration of the housing base body, provides the particular advantages that it can be well filled with the encapsulant and that a region of the recess serving as a reflector is not reduced in size, compared to conventional components of like design, because of the inventive geometry of the recess.

In another advantageous configuration, the shaded subarea is formed by at least one, or where space-saving is necessary preferably by means of only one, cross sectionally concave bevel of the wall at the front-side margin thereof. By virtue of this configuration, a shaded subarea can be obtained even in a housing base body having a larger recess and radiation that strikes the wall at a low angle.

A housing base body according to the invention is used particularly preferably in semiconductor components provided with a semiconductor chip that emits at least partially UV radiation, such as for example a blue light or UV radiation emitting, nitride compound semiconductor material based light-emitting diode (LED) chip, of the kind which is described for example in WO 01/39282 A2 and which consequently will not be elaborated upon here.

"Nitride compound semiconductor based" means in the present context that the radiation generating epitaxial layer sequence or at least a portion thereof includes a nitride III/V compound semiconductor material, preferably $Al_nGa_mIn_{l-n-m}N$, wherein $0 \leq n \leq 1$, $0 \leq m \leq 1$ and $n+m \leq 1$. The composition of this material does not necessarily have to conform mathematically exactly to the above formula. Rather, it can comprise one or more dopants or additional constituents that do not substantially alter the characteristic physical properties of one of the $Al_nGa_mIn_{l-n-m}N$ materials. For the sake of simplicity, however, the above formula includes only the essential constituents of the crystal lattice (Al, Ga, In, N), even though these may be partially replaced by trivial amounts of additional substances.

The encapsulant is preferably based on silicone material and is in particular a silicone resin. Using an encapsulant that has a gel-like consistency can further help to reduce the risk of delamination.

With a view toward further reducing the risk of delamination, it can be advantageous to provide anchoring elements, which are formed at, preferably on, the shaded subarea(s) of the inner side and protrude from the shaded subarea or from the remaining inner side of the recess into the encapsulant. These anchoring elements are preferably arranged so that they are distributed evenly on the shaded subarea, that is, at substantially the same distances from one another.

Suitable anchoring elements are anchoring lugs, knobs or ribs protruding from the shaded subarea. The anchoring elements are particularly preferably completely covered, i.e. spanned, by the encapsulant. To this end, the fill level of the encapsulant inside the recess is in particular so high that the encapsulant completely covers the anchoring elements. This in turn tends to prevent delamination and also facilitates the further processing of the component using conventional pick-and-place devices.

Such anchoring elements can advantageously also help to cause an encapsulant, such as silicone resin, which is poured into the recess in the liquid state to be drawn up along the anchoring elements due to the forces created by the capillarity of the encapsulating material, thus helping to moisten the subarea(s) and the upper margin of the recess.

The above-cited object is accordingly achieved in particular by means of a semiconductor component in which the encapsulant forms a sealing strip on at least one shaded subarea that is located at the outer margin of the recess of the housing base body and is at least in substantial part shaded from the radiation emitted by the semiconductor chip, said sealing strip therefore being shaded virtually completely against the radiation from the chip. Particularly preferably, the encapsulant forms a thoroughly shaded sealing ring on a shaded subarea that extends ring-like all the way around the semiconductor chip.

The rest of the recess is preferably configured as a reflector for the radiation emitted by the semiconductor chip.

In a particularly preferred embodiment, the housing base body is formed on a metallic leadframe from a plastic molding compound, particularly by an injection molding and/or compression molding process.

The encapsulant can contain admixtures of phosphors that absorb a portion of the radiation emitted by the semiconductor chip and emit radiation having a changed wavelength compared to the absorbed radiation. The semiconductor chip can also be provided with a cladding layer containing a phosphor material. LED components capable of emitting mixed-color light or color-matched light can thus be produced in a simple manner. Suitable phosphor materials are described for example in WO 97/50132 and WO 98/12757 A1, whose disclosure content in this regard is hereby incorporated by reference.

The outermost edge of the upper margin of the recess or shaded subarea is preferably virtually smooth, i.e., devoid of grooves, indentations, shrink holes or the like. This advantageously reduces the risk that the encapsulant will overflow as the recess is being filled. To ensure a smooth edge, the anchoring elements, if present, preferably do not extend as far as the outer margin of the recess.

The foregoing statements regarding the components according to the invention apply analogously to the housing base body according to the invention.

A component housing (housing base body+encapsulant) according to the invention not only can be used to advantage with radiation emitting components whose semiconductor chip emits in particular at least partially UV radiation, but can also be used to advantage (e.g. increased heat resistance) with radiation detecting components such as photodiode and phototransistor components.

A component/housing (housing base body+encapsulant) configured according to the present invention makes it possible to implement designs with comparatively tiny dimensions, since the recess comprises the shaded subarea(s) only at the front-side end of the housing base body, that is, immediately at the transition from the inner wall of the recess to the outer front side of the housing base body.

A further particular advantage is that the "three-phase" boundary line between the housing base body, the encapsulant and the air (or other surrounding atmosphere) is exposed to little or no radiation from the semiconductor chip.

Further advantages and advantageous improvements of the component and the housing base body will become apparent from the following exemplary embodiments, described hereinafter with reference to FIGS. 1 to 6.

Figure 1:
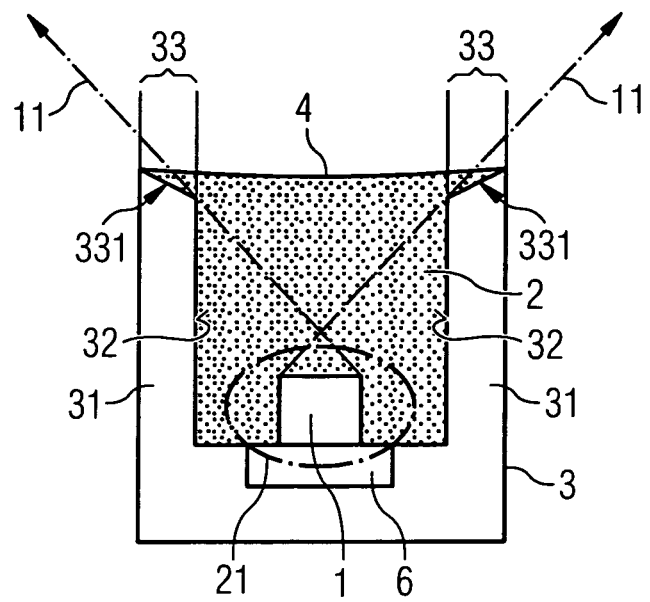
FIG. 1 is a schematic representation of a sectional view through a first exemplary embodiment of a component according to the invention.

In the figures, elements of the same kind or identically acting elements of the exemplary embodiments are each identified in the same respective fashion and are provided with the same respective reference numerals. The figures are basically not to be considered true-to-scale representations of real devices according to the invention. Rather, for purposes of better understanding, some elements of the exemplary embodiments in the figures may be depicted as exaggeratedly large or in size ratios that do not accord with reality.

DETAILED DESCRIPTION OF THE PREFERRED EMBODIMENTS

Each of the components and housing base bodies schematically depicted in the figures is a surface-mountable so-called sidelooker LED component or a surface-mountable housing base body 3 for such an LED component, comprising an LED chip 1 emitting UV radiation and, where applicable, other types of radiation, for example an InGaN based visible blue light emitting LED chip which intentionally or unintentionally also emits UV radiation. Such an LED chip is described for example in WO 01/39282 A2 and will not be described in more detail herein.

The component housing and housing base body set forth in this context are also suitable in principle for use with other types of LED chips, as well as for IR emitting components intended in particular for high-temperature applications.

The LED chip 1 is mounted in a chip region (indicated by the regions 21 bordered by broken lines in FIGS. 1 to 4) of the housing base body 3 on an electrical chip connection part of a metallic leadframe 6 and is connected via a bonding wire 5 to a wire connection region of an electrical wire connection part 61 of leadframe 6 that is electrically separated from chip connection part 62.

LED chips contacted in other ways, such as for example flip-chip-mounted LED chips, in which the anode and cathode contacts are disposed on one side of the chip, facing the leadframe, can also be used in the present case. All that has to be done for this purpose is to adapt the mounting technique.

Disposed on the leadframe 6 is an injection-molded or transfer-molded housing base body 3, made for example of thermoplastic plastic (e.g. a titanium-oxide or silicon-oxide and/or glass-fiber filled, polyphthalamide based molding compound) and comprising a recess 2. The LED chip 1 is located in the recess 2 and is for example electrically conductively fastened to the chip connection part 62 by means of a conductive glue.

The recess 2 is bounded laterally by a wall 31 surrounding the semiconductor chip 1 and is at least partially filled with a silicone resin based encapsulant 4, which covers the semiconductor chip 1 and is well transparent to an electromagnetic radiation emitted by the semiconductor chip 1.

The encapsulant 4 includes for example a radiation-transparent, for example clear, gel-like, silicone-based potting material, into which is mixed a phosphor powder 7, for example a YAG:Ce, TbAG:Ce or TbYAG:Ce based phosphor powder. Such phosphors are known for example from WO 98/12757 and WO 01/08452, whose disclosure content in this regard is hereby incorporated by reference.

In components designed solely to emit primary radiation from the LED chip 1, the encapsulant can be a clear, gel-like, silicone-based potting material. Alternatively, it can be provided with diffuser particles and rendered turbid thereby.

An inner side 32 bounding recess 2 comprises, at the front-side end of wall 31, a chamfer 331 that slopes downward toward the interior of recess 2, i.e. toward semiconductor chip 1, and extends all the way around the recess. As viewed looking down on the front side of the semiconductor component, this chamfer 331 creates a shaded subarea 33 which extends ring-like all the way around the semiconductor chip 1, and which is in shadow as viewed from all front-side points of the semiconductor chip 1 and which is at least partially covered by encapsulant 4 all the way around the semiconductor chip 1. The front-side margin of the recess is configured as funnel-like. The shaded subarea is simultaneously the front-side end face of wall 31.

Figure 2:
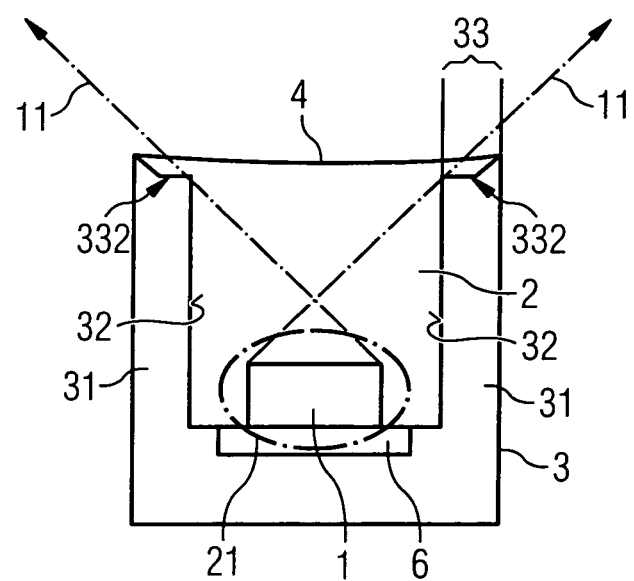
FIG. 2 is a schematic representation of a sectional view through a second exemplary embodiment of a component according to the invention.
Figure 4:
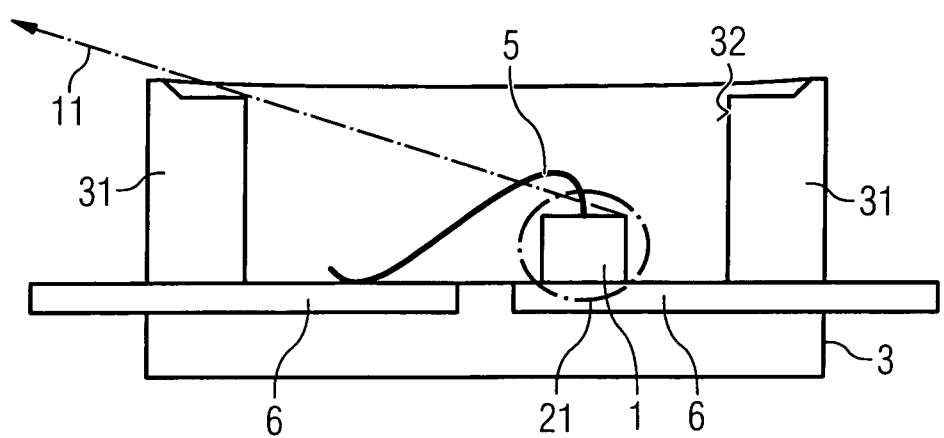
FIG. 4 is a schematic representation of a further sectional view through the second exemplary embodiment.
Figure 5:
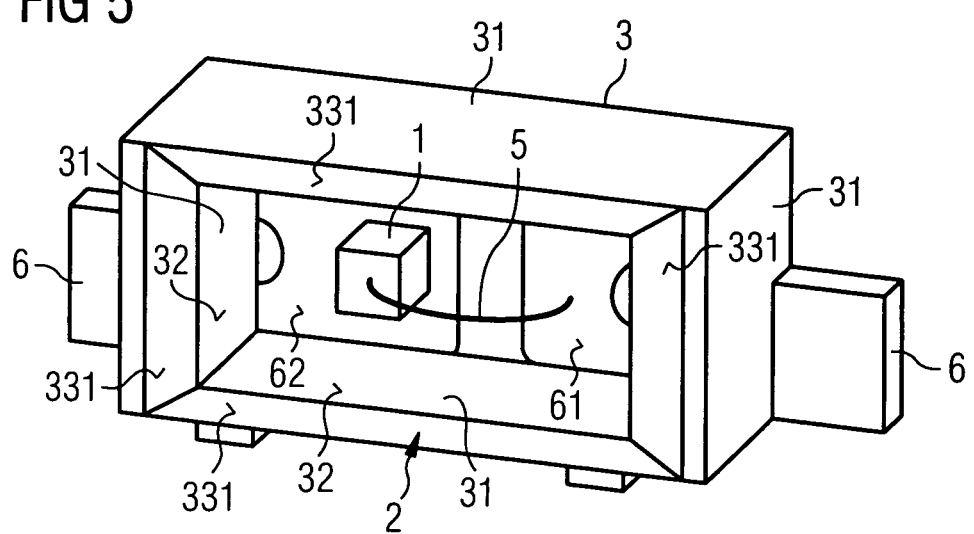
FIG. 5 is a schematic representation of a perspective plan view of the housing base body of the first exemplary embodiment.

The second exemplary embodiment, as illustrated in FIGS. 2 and 4, differs from the above-described first exemplary embodiment particularly in that the annularly extending shaded subarea 33 of inner side 32 is formed by a cross-sectionally concave bevel 332 of the front-side end face of wall 31.

Figure 3:
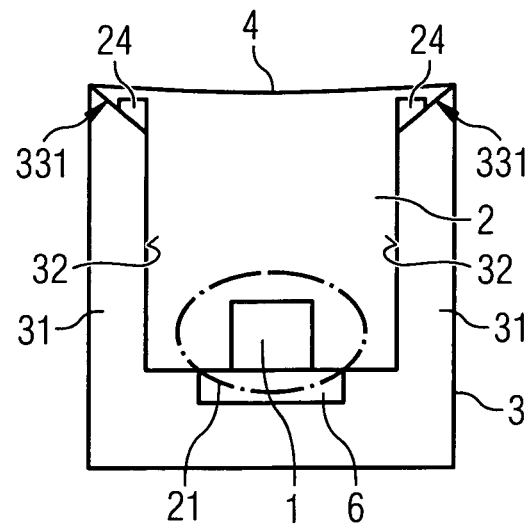
FIG. 3 is a schematic representation of a sectional view through a third exemplary embodiment of a component according to the invention.
Figure 6:
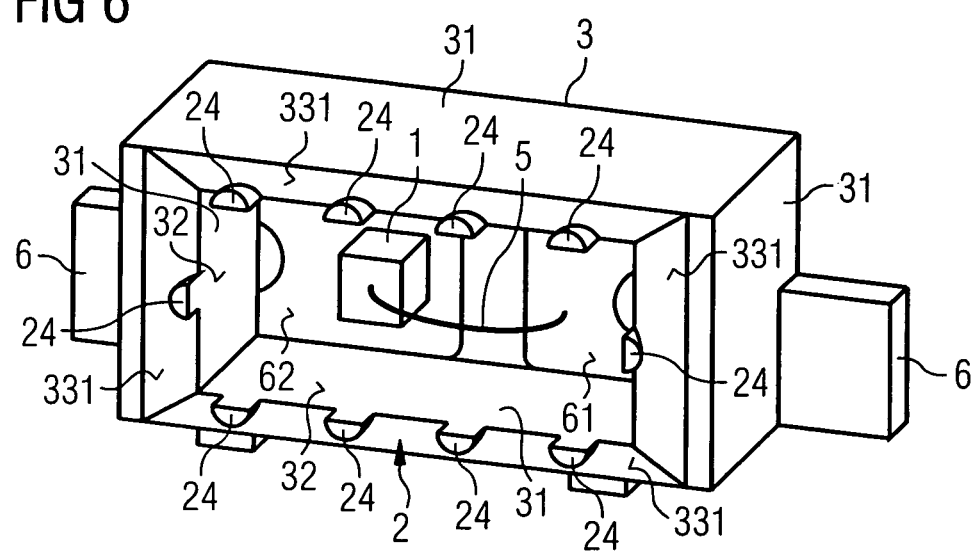
FIG. 6 is a schematic representation of a perspective plan view of the housing base body of the third exemplary embodiment.

The third exemplary embodiment, illustrated in FIGS. 3 and 6, differs from the above-described first exemplary embodiment particularly in that a plurality of anchoring elements 24, here in the form of anchoring knobs, are formed, evenly distributed around recess 2, at annularly extending shaded subarea 33. These anchoring knobs protrude from shaded subarea 33 into encapsulant 4 but do not pass all the way through it, that is, they are completely covered by encapsulant 4. Viewed from the semiconductor chip 1, the encapsulant extends all the way around behind anchoring elements 24 on shaded subarea 33.

In all the exemplary embodiments, the housing base body 3 is preferably formed as one piece with the anchoring elements 24 and is preferably fabricated in a single injection molding or compression molding operation.

Housing base bodies and encapsulants in accordance with the exemplary embodiments can also be used for radiation receiving semiconductor chips, such as photodiode chips. A photodiode chip can then be used in place of the LED chip 1. The design according to the invention is also suitable for use with laser diode components and detector components and in high-temperature applications.

The explanation of the technical teaching according to the invention on the basis of the exemplary embodiment is not, of course, to be construed as limiting the invention to those embodiments. Rather, for example all components and housing base bodies comprising a recess for receiving a semiconductor chip and a circumferential chamfer or the like disposed on the front-side margin of the recess and shaded from the radiation emitted by the semiconductor chip make use of the technical teaching of the invention.

The invention claimed is:

1. An optoelectronic semiconductor component arranged in a surrounding atmosphere, the semiconductor component comprising:

a housing base body having a recess, the recess extending into the housing base body from a front side of the housing base body;

at least one radiation emitting semiconductor chip disposed in the recess; and an encapsulant at least partially filling the recess;

wherein the recess has a bottom surface remote from the front side of the housing base body and the recess is bounded laterally by an inner side surface of a wall, the inner side surface extending from the front side of the housing base body to the bottom surface of the recess;

wherein the radiation emitting semiconductor chip is mounted on the bottom surface of the recess and is laterally surrounded by the inner side surface of the wall;

wherein the encapsulant covers the semiconductor chip and is substantially transmissive to an electromagnetic radiation emitted by the semiconductor chip;

wherein the encapsulant contains a silicone-based material;

wherein the wall is made from a plastic material such that the inner side surface is a surface of the plastic material which extends from the front side of the housing base body to the bottom surface of the recess on which the radiation-emitting semiconductor chip is mounted and provides an interface where the encapsulant bonds to the plastic material, said interface extending from the front side of the housing base body to the bottom surface of the recess;

wherein the wall is shaped such that a shaded subarea is formed which extends all the way around the at least one semiconductor chip and which is not directly illuminated by the radiation emitted from the radiation emitting semiconductor chip;

wherein the shaded subarea is at least partially covered by the encapsulant and the encapsulant extends from the shaded subarea to the semiconductor chip and covers the semiconductor chip;

wherein the surrounding atmosphere, the encapsulant and the housing base body define a three-phase boundary; and the shaded subarea is disposed at a top margin of the wall in such fashion that the three-phase boundary between the surrounding atmosphere, the encapsulant and the housing base body extends all the way around the at least one semiconductor chip entirely within the shaded subarea which is not directly illuminated by the radiation emitted from the radiation emitting semiconductor chip.

2. The semiconductor component as in claim 1, wherein the shaded subarea of said inner side is formed at the margin thereof with the front side of said housing base body.

3. The semiconductor component as in claim 1, the shaded subarea of said inner side is the front side of said housing base body.

4. The semiconductor component as in claim 1, wherein the shaded subarea of said inner side comprise at least one chamfer at the front-side margin of said wall.

5. The semiconductor component as in claim 1, wherein the shaded subarea is formed by at least one cross-sectionally concave bevel of said wall at the front-side margin thereof.

6. The semiconductor component as in claim 1, wherein said semiconductor chip comprises a material suitable for emitting at least partially UV radiation.

7. The semiconductor component as claim 1, wherein said encapsulant contains a silicone based material, particularly silicone resin.

8. The semiconductor component as in claim 1, wherein said encapsulant has a gel-like consistency.

9. The semiconductor component as in claim 1, further comprising at least one anchoring element that protrudes into said encapsulant is formed at said at least one subarea of said inner side.

10. The semiconductor component as in claim 1, further comprising plural anchoring elements arranged at the shaded subarea of said inner side in a distributed manner, particularly so as to be evenly distributed about said recess, and protrude from the shaded subarea into said encapsulant.

11. The semiconductor component as in claim 9, wherein said at least one anchoring element is formed of at least one of an anchoring lug, a knob, and a rib, said at least one anchoring element protruding from the shaded subarea of said inner side and said encapsulant spans said at least one anchoring element.

12. The semiconductor component as in claim 1, wherein said encapsulant forms a continuous sealing ring around said recess on the shaded subarea of said inner side.

13. The semiconductor component as in claim 1, wherein said recess is configured as a reflector for the radiation emitted by said semiconductor chip.

14. The semiconductor component as in claim 1, wherein said housing base body is prefabricated on a metallic leadframe in one piece from a plastic molding compound, particularly by injection or compression.

15. The semiconductor component as in claim 1, wherein said encapsulant contains at least one phosphor material suitable for absorbing a portion of the radiation emitted by said semiconductor chip and emitting radiation of a changed wavelength compared to the absorbed radiation.

16. The semiconductor component as claim 1, wherein said semiconductor chip comprises at least one phosphor material suitable for absorbing a portion of the radiation emitted by said semiconductor chip and emitting radiation of a changed wavelength compared to the absorbed radiation.

17. The semiconductor component as in claim 1, wherein the encapsulant contains a silicone-based material and the inner side surface provides an interface where the silicone-based material bonds to the plastic material.

18. The semiconductor component as in claim 1, wherein the encapsulant does not project beyond the recess in the direction of the front side of the housing base body.

19. An optoelectronic semiconductor component arranged in a surrounding atmosphere, the semiconductor component comprising:

a housing base body defining a recess bounded laterally by an inner side of a wall;

at least one radiation emitting semiconductor chip disposed in the recess with the wall surrounding the semiconductor chip;

an encapsulant at least partially filling the recess;

wherein the encapsulant covers the semiconductor chip and is substantially transmissive to an electromagnetic radiation emitted by the semiconductor chip;

wherein the-wall is shaped such that a shaded subarea is formed which extends all the way around the at least one semiconductor chip and which is not directly illuminated by the radiation emitted from the radiation emitting semiconductor chip;

wherein the shaded subarea is at least partially covered by the encapsulant and the encapsulant extends from the shaded subarea to the semiconductor chip and cover the semiconductor chip;

wherein the surrounding atmosphere, the encapsulant and the housing base body define a three-phase boundary; and the shaded subarea is disposed at the top margin of the wall in such fashion that the three-phase boundary between the surrounding atmosphere, the encapsulant and the housing base body extends all the way around the at least one semiconductor chip entirely within the shaded subarea which is not directly illuminated by the radiation emitted from the radiation emitting semiconductor chip.

20. The semiconductor component as in claim 2, wherein the inner side surface extends perpendicular to the bottom surface of the recess in a region between the bottom surface and the shaded subarea which is not directly illuminated by the radiation emitted from the semiconductor chip.

21. The semiconductor component as in claim 1, wherein the housing base body is formed of a thermoplastic material and wherein, in top view of the front side, the semiconductor chip is mounted off center on the bottom surface of the recess.

22. The semiconductor component of claim 19, wherein each straight line connecting a first point on a top surface of the radiation emitting semiconductor chip with a second point on the three-phase boundary between the surrounding atmosphere, the encapsulant and the housing base body crosses the inner side of the wall.

23. An optoelectronic semiconductor component arranged in a surrounding atmosphere, the semiconductor component comprising:
 a housing base body defining a recess bounded laterally by an inner side of a wall;
 at least one radiation emitting semiconductor chip disposed in the recess with the wall surrounding the semiconductor chip, the wall shaped such that a shaded subarea is formed at the top margin of the wall which extends all the way around the at least one semiconductor chip and which is not directly illuminated by the radiation emitted from the radiation emitting semiconductor chip; and
 an encapsulant substantially transmissive to an electromagnetic radiation emitted by the semiconductor chip covering the semiconductor chip and at least partially filling the recess such that the surrounding atmosphere, the encapsulant and the housing base body define a three-phase boundary, the encapsulant at least partially covering the shaded subarea, extending from the shaded subarea to the semiconductor chip, and covering the semiconductor chip;
 wherein the three-phase boundary between the surrounding atmosphere, the encapsulant and the housing base body extends all the way around the at least one semiconductor chip entirely within the shaded subarea which is not directly illuminated by the radiation emitted from the radiation emitting semiconductor chip; and
 wherein each straight line connecting a first point on a top surface of the radiation emitting semiconductor chip with a second point on the three-phase boundary between the surrounding atmosphere, the encapsulant and the housing base body crosses the inner side of the wall.

* * * * *

UNITED STATES PATENT AND TRADEMARK OFFICE
CERTIFICATE OF CORRECTION

| | | |
|---|---|---|
| PATENT NO. | : 8,975,646 B2 | Page 1 of 1 |
| APPLICATION NO. | : 11/597971 | |
| DATED | : March 10, 2015 | |
| INVENTOR(S) | : Karlheinz Arndt | |

It is certified that error appears in the above-identified patent and that said Letters Patent is hereby corrected as shown below:

Title Page

Col. 2 (Abstract), Line 7, delete "chip An" and insert -- chip. An --

In the Claims

Column 7

Line 63, in Claim 7, delete "as claim" and insert -- as in claim --

Line 64, in Claim 7, delete "silicone based" and insert -- silicone-based --

Column 8

Line 32, in Claim 16, delete "as claim" and insert -- as in claim --

Line 56, in Claim 19, delete "the-wall" and insert -- the wall --

Signed and Sealed this
Twenty-first Day of July, 2015

Michelle K. Lee
*Director of the United States Patent and Trademark Office*